United States Patent
Saito et al.

(10) Patent No.: US 11,906,594 B2
(45) Date of Patent: Feb. 20, 2024

(54) METHOD FOR ESTIMATING INTERNAL RESISTANCE OF SECONDARY BATTERY AND ANOMALY DETECTION SYSTEM OF SECONDARY BATTERY

(71) Applicant: SEMICONDUCTOR ENERGY LABORATORY CO., LTD., Atsugi (JP)

(72) Inventors: Jo Saito, Kanagawa (JP); Mayumi Mikami, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 267 days.

(21) Appl. No.: 17/612,323

(22) PCT Filed: May 15, 2020

(86) PCT No.: PCT/IB2020/054599
§ 371 (c)(1),
(2) Date: Nov. 18, 2021

(87) PCT Pub. No.: WO2020/240324
PCT Pub. Date: Dec. 3, 2020

(65) Prior Publication Data
US 2022/0260643 A1   Aug. 18, 2022

(30) Foreign Application Priority Data

May 24, 2019   (JP) .................. 2019-097257

(51) Int. Cl.
*G01R 31/389*   (2019.01)
*G01R 31/367*   (2019.01)
(Continued)

(52) U.S. Cl.
CPC .......... *G01R 31/389* (2019.01); *B60L 3/0046* (2013.01); *B60L 7/18* (2013.01);
(Continued)

(58) Field of Classification Search
CPC .... G01R 31/389; G01R 31/367; G01R 31/36; B60L 3/0046; B60L 7/18; B60L 58/12;
(Continued)

(56) References Cited

U.S. PATENT DOCUMENTS 10,011,188 B2 * 7/2018 Minamiura ........... B60W 10/26
10,310,022 B2   6/2019 Park et al.
(Continued)

FOREIGN PATENT DOCUMENTS

CN   107037375 A   8/2017
CN   108336427 A   7/2018
(Continued)

OTHER PUBLICATIONS

International Search Report (Application No. PCT/IB2020/054599) dated Sep. 1, 2020.
(Continued)

*Primary Examiner* — Christopher E Mahoney
(74) *Attorney, Agent, or Firm* — Fish & Richardson P.C.

(57) ABSTRACT

An electric automobile incorporating a secondary battery has a disadvantage such as a difficulty in knowing the remaining capacity accurately and in predicting the time when the remaining capacity becomes zero because of deterioration of the secondary battery. The internal resistance is estimated with high accuracy even when the secondary battery deteriorates. Data used for learning or estimation is a data group (also referred to as data with regenerative charging) that is limited to data acquired within a certain time range around the end of regenerative charging. Such data within the limited range is extracted, used for learning, and subjected to the estimation. Thus, a value of the internal resistance can be output with high accuracy, specifically, with a mean error rate of 1% or less.

4 Claims, 8 Drawing Sheets

(51) Int. Cl.
*B60L 58/12* (2019.01)
*B60L 3/00* (2019.01)
*B60L 7/18* (2006.01)
*H01M 10/48* (2006.01)

(52) U.S. Cl.
CPC ............ *B60L 58/12* (2019.02); *G01R 31/367* (2019.01); *H01M 10/48* (2013.01); *B60L 2240/545* (2013.01); *B60L 2240/547* (2013.01); *B60L 2240/549* (2013.01)

(58) Field of Classification Search
CPC . B60L 7/00; B60L 7/10; H01M 10/44; H01M 10/48
See application file for complete search history.

(56) References Cited

U.S. PATENT DOCUMENTS

| | | |
|---|---|---|
| 10,359,474 B2 | 7/2019 | Soga et al. |
| 10,386,418 B2 | 8/2019 | Takegami et al. |
| 10,459,037 B2 | 10/2019 | Nishigaki et al. |
| 10,775,439 B2 | 9/2020 | Song et al. |
| 10,938,075 B2 | 3/2021 | Fujita et al. |
| 11,215,675 B2 | 1/2022 | Shin et al. |
| 2006/0064130 A1 | 3/2006 | Dodd et al. |
| 2006/0181245 A1 | 8/2006 | Mizuno et al. |
| 2008/0084185 A1 | 4/2008 | Nakazawa |
| 2010/0185405 A1* | 7/2010 | Aoshima ................ B60L 58/22 702/63 |
| 2012/0065827 A1 | 3/2012 | Kimura et al. |
| 2012/0177974 A1 | 7/2012 | Nakajima et al. |
| 2014/0077815 A1 | 3/2014 | Mattisson et al. |
| 2014/0125281 A1 | 5/2014 | Mitsutani |
| 2014/0167704 A1 | 6/2014 | Lafontaine et al. |
| 2014/0236379 A1 | 8/2014 | Masuda et al. |
| 2014/0329118 A1 | 11/2014 | Nagase et al. |
| 2016/0049821 A1 | 2/2016 | Aridome |
| 2017/0050527 A1 | 2/2017 | Tsuchiya |
| 2017/0259684 A1* | 9/2017 | Lee ................... H01M 10/4207 |
| 2018/0128880 A1 | 5/2018 | Miyamoto et al. |
| 2018/0203070 A1 | 7/2018 | Park |
| 2019/0033397 A1 | 1/2019 | Karner et al. |
| 2019/0077273 A1 | 3/2019 | Jang et al. |
| 2020/0001724 A1 | 1/2020 | Jordan, III et al. |
| 2020/0072909 A1* | 3/2020 | Soejima ............... G01R 31/392 |
| 2020/0076223 A1 | 3/2020 | Kuriki et al. |
| 2020/0116797 A1 | 4/2020 | Tsurutani et al. |
| 2020/0132774 A1 | 4/2020 | Hara et al. |
| 2020/0278398 A1 | 9/2020 | Isa. et al. |
| 2020/0292624 A1 | 9/2020 | Tajima et al. |
| 2022/0006313 A1 | 1/2022 | Lim et al. |

FOREIGN PATENT DOCUMENTS

| | | | |
|---|---|---|---|
| EP | 3351953 A | 7/2018 | |
| JP | 2001-228222 A | 8/2001 | |
| JP | 2001-233065 A | 8/2001 | |
| JP | 2009-146843 A | 7/2009 | |
| JP | 2011-019328 A | 1/2011 | |
| JP | 2014-186007 A | 10/2014 | |
| JP | 2015-202010 A | 11/2015 | |
| JP | 2017-040615 A | 2/2017 | |
| KR | 2018-0085165 A | 7/2018 | |
| WO | WO-03071617 A2 * | 8/2003 | .......... B60L 11/1861 |
| WO | WO-2010/106588 | 9/2010 | |
| WO | WO-2013/115244 | 8/2013 | |
| WO | WO-2019/053557 | 3/2019 | |

OTHER PUBLICATIONS

Written Opinion (Application No. PCT/IB2020/054599) dated Sep. 1, 2020.

* cited by examiner

FIG. 6

```
·Record of program including source code stored in memory
In [1]:
import pandas as pd
import warnings
import numpy as np
warnings.filterwarnings('ignore')

In [2]:
df = pd.read_csv("x_labels.csv")
x_train = df.iloc[np.arange(0, len(df), 2)]
x_test = df.iloc[np.arange(1, len(df), 2)]

In [3]:
df = pd.read_csv("y_labels.csv")
y_train = df.iloc[np.arange(0, len(df), 2)]
y_test = df.iloc[np.arange(1, len(df), 2)]

In [4]:
from sklearn.ensemble import ExtraTreesClassifier
model = ExtraTreesClassifier()

In [5]:
model.fit(x_train,y_train)
y_predicted = model.predict(x_test)

In [6]:
np.savetxt('result_data_resistance_Extratrees_test.csv',y_pr
edicted,delimiter=',')
```

METHOD FOR ESTIMATING INTERNAL RESISTANCE OF SECONDARY BATTERY AND ANOMALY DETECTION SYSTEM OF SECONDARY BATTERY

CROSS REFERENCE TO RELATED APPLICATIONS

This application is a U.S. National Phase Application under 35 U.S.C. § 371 of International Application PCT/IB2020/054599, filed on May 15, 2020, which is incorporated by reference and claims the benefit of a foreign priority application filed in Japan on May 24, 2019, as Application No. 2019-097257.

TECHNICAL FIELD

One embodiment of the present invention relates to an object, a method, or a manufacturing method. Alternatively, the present invention relates to a process, a machine, manufacture, or a composition (composition of matter). One embodiment of the present invention relates to a semiconductor device, a display device, a light-emitting device, a power storage device, a lighting device, an electronic device, or a manufacturing method thereof. In addition, one embodiment of the present invention relates to a method for estimating the state of charge of a power storage device, a system for estimating the state of charge of a power storage device, and an anomaly detection method. In particular, one embodiment of the present invention relates to a system for estimating the state of charge of a power storage device and a system for detecting an anomaly of a power storage device.

Note that in this specification, a power storage device refers to every element and device having a function of storing power. For example, the power storage device includes a storage battery (also referred to as secondary battery) such as a lithium ion secondary battery, a lithium ion capacitor, a nickel hydrogen battery, an all-solid-state battery, and an electric double layer capacitor.

One embodiment of the present invention relates to a neural network and an anomaly detection system of a power storage system using the neural network. One embodiment of the present invention relates to a vehicle using a neural network. One embodiment of the present invention relates to an electronic device using a neural network. One embodiment of the present invention is not limited to a vehicle, and can also be applied to a power storage device for storing electric power obtained from power generation facilities such as a solar power generation panel provided in a structure body or the like, and relates to a system for detecting an anomaly in facilities.

BACKGROUND ART

The internal resistance of a secondary battery is a characteristic value to know the state of the secondary battery. The internal resistance changes depending on SOC (State of Charge). Thus, there is a possibility that SOC can be estimated from a value of the internal resistance. It is known that an increase in the internal resistance is due to a thick film on a surface of a negative electrode, which is made by repeating charging and discharging of a secondary battery. When the internal resistance of the secondary battery is calculated, the degree of deterioration of the secondary battery can be examined on the basis of the internal resistance. Accurate measurement of the internal resistance is difficult unless the charging and discharging are performed under specific conditions.

In recent years, machine learning techniques such as an artificial neural network (hereinafter referred to as a neural network) have been actively developed.

Patent Document 1 shows an example where a neural network is used for calculation of the remaining capacity of a secondary battery.

REFERENCE

Patent Document [Patent Document 1] United States Published Patent Application No. 2006/0181245

SUMMARY OF THE INVENTION

Problems to be Solved by the Invention

In a vehicle in which a secondary battery is incorporated, regenerative power generated at braking or the like can be charged (also referred to as regenerative charging) to the secondary battery, and the secondary battery might not be used properly due to overcharging. In order to avoid occurrence of the problem of overcharging or overdischarging in advance, the remaining capacity of the secondary battery, i.e., the SOC of the secondary battery needs to be estimated with high accuracy. A method for estimating the state of charge of a secondary battery with high estimation accuracy or a method for controlling a power storage device is provided.

In general electric vehicles incorporating a secondary battery, the remaining capacity is checked in the practical use, i.e., running or temporary stop of the electric vehicles. The remaining capacity is conventionally calculated from the accumulation of voltage or discharging current of the secondary battery. With this method, a deviation from actual remaining capacity occurs unless the deterioration degree of the battery is considered. Thus, the deviation increases by repeating charging and discharging of the secondary battery, which makes it difficult to check the remaining capacity with high accuracy.

The electric vehicle incorporating the secondary battery has a disadvantage such as a difficulty in accurately knowing the remaining capacity of the secondary battery because of its deterioration; thus, it is difficult to predict when the remaining capacity becomes zero. The existing electric vehicles, in some cases, display a rough travel distance when the battery is fully charged, and display not a possible travel distance but only a warning when the remaining capacity is low.

An object is to estimate the internal resistance with high accuracy even when a secondary battery deteriorates. Another object is to analyze the state of a secondary battery, such as remaining capacity, with low cost and high accuracy, on the basis of the internal resistance.

Another object is to detect an anomaly on the assumption that a large change in the internal resistance is the anomaly.

When a neural network is used, an output value varies depending on an algorithm to be used, the type and quantity of data, or the like. This does not mean that the more accumulated data is used, the more accurate value can be calculated.

Another object is to estimate the internal resistance from data obtained when an electric vehicle incorporating a secondary battery is practically used, for example, is in an operating state such as a running or temporary-stop state.

Means for Solving the Problems

An estimation device of the internal resistance of a secondary battery is incorporated in a vehicle to estimate the internal resistance with high accuracy even when the secondary battery deteriorates.

The estimation device performs estimation of the internal resistance of a secondary battery on the basis of learning data and a learning model obtained in advance. The estimation device includes at least a data processing portion and a memory portion. The data processing portion includes a CPU (Central Processing Unit), a ROM, a RAM, and the like. The CPU reads out a program corresponding to processing content from the memory portion or the ROM, develops it to the RAM, and runs the developed program, thereby executing determined processing.

A program of software running an inference program for the neural network processing of the estimation can be described in a variety of programing languages such as Python, Go, Perl, Ruby, Prolog, Visual Basic, C, C++, Swift, Java (registered trademark), and .NET. The application may be designed using a framework such as Chainer (it can be used with Python), Caffe (it can be used with Python and C++), and TensorFlow (it can be used with C, C++, and Python).

The system requirements are set to execute at least the software of Python. Instead of the CPU, an integrated IC chip including a GPU (Graphics Processing Unit), a PMU (Power Management Unit), or the like may be used. A chip in which a CPU and a GPU are integrated is sometimes referred to as an APU (Accelerated Processing Unit), and this APU chip can also be used. Alternatively, an FPGA (field-programmable gate array) may be used.

It is desirable that the estimation device perform estimation based on data whose amount is as small as possible and output an estimated value with high accuracy. With the small amount of data, the amount of learning data to be accumulated can be reduced, resulting in a reduction in memory capacity for storing the data. Moreover, the small amount of data enables a time required for calculation processing to be reduced.

In the estimation device, the processing to be executed is divided into a first stage for performing learning and a second stage for performing estimation.

Data for learning and estimation is a data group (also referred to as data with regenerative charging) that is limited to data acquired within a certain time range around the end of regenerative charging. Learning and estimation are performed with use of such data in a limited range, which enables output of a value of internal resistance with high accuracy, specifically, with a mean error rate of 1% or less. Constructing such a learning model means a learning stage (a learning phase).

At the first stage, data with regenerative charging is acquired, and then a learning model based on the data is constructed. Thus, data is acquired within a rest time for approximately a few minutes after the stop of regenerative charging that has been performed at the time when a running vehicle decelerates (or stops). This data corresponds to data acquired within a certain time range around the end of regenerative charging. For learning data, data in the following case is acquired in advance: the case of using a secondary battery, which is the same kind as a secondary battery in the vehicle subjected to estimation, under a different temperature condition and a different deterioration rate.

After that, the processing enters the second stage. Data in the case of regenerative charging performed while the vehicle is running (data acquired within a certain time range around the end of regenerative charging) is acquired, and a program is executed, so that a system can be constructed. The system enables the followings: the output of the internal resistance with high accuracy in driving states including a temporary stop; tests of the remaining capacity, the deterioration rate, or the like based on the internal resistance; and anomaly detection where a large change in internal resistance is regarded as an anomaly. Obtaining the internal resistance from the learning results using the learning model means a determination stage (a determination phase). A driver can obtain internal resistance in the case where the learning results are obtained in advance and at least the determination stage is implemented in a vehicle although both the learning stage and the determination stage may be implemented in the vehicle. In the case where the data acquired during running is used as a learning parameter, the implementation of both the learning stage and the determination stage in the vehicle enables the driver to check the remaining capacity, the deterioration rate, or the like, accurately. In addition, the anomaly detection where a large change in internal resistance is regarded as an anomaly can be performed. The remaining capacity of the secondary battery can be calculated after the end of charging of the secondary battery or during discharging of the secondary battery (specifically, while a vehicle is running) as appropriate.

The case of using data without regenerative charging, i.e., data acquired only in a resting time, for comparison, results in a lowering of accuracy.

The data acquired within a certain time range around the end of regenerative charging is called data with regenerative charging, and the data with regenerative charging is regarded as learning data or collected data; accordingly, highly accurate detection of internal resistance can be achieved.

The regenerative charging indicates that the load on a driving motor is converted into power so that a lithium ion secondary battery is charged.

The inventors and the like found that highly accurate estimation can be performed with use of data acquired within a certain time range around the end of regenerative charging. The data is accumulated and inferred in a learned neural network portion, whereby the internal resistance of a secondary battery can be estimated. For example, a driver can check an estimation result of the internal resistance of the secondary battery after a temporary stop during running. Since the regenerative charging is performed at the time of deceleration or stop, the data can be acquired at the time of normal running or temporary stop, which enables inferences.

Alternatively, regenerative charging and rest may be performed intendedly. In that case, a regenerative charging control circuit for acquiring data with regenerative charging may be provided separately. The regenerative charging control circuit in such a case can be called a sampling circuit. The regenerative charging is performed in a short time at the timing of acquiring data, and after that, the charging is stopped. The state of stopping the charging is held (this state is also referred to as a rest) for one minute, and then data from the start of the regenerative charging to the end of rest is acquired. In other words, the time period of regenerative charging enabled by deceleration is temporarily cut. Alternatively, the regenerative charging may be controlled to be temporarily end. This processing is performed to infer the internal resistance. In this processing, the regenerative charging is temporarily stopped and data of a short time period of stopping charging is used; accordingly, an estimated value with high accuracy is obtained.

Even when discharging to some extent occurs during the time period of stopping charging, unless it is abrupt discharging, the estimated value is less affected. In other words, there is no problem if current consumes due to lighting of a display or a headlight on a vehicle during the time period of stopping charging. The time period of stopping charging means not the stop of using a secondary battery but the stop of charging.

The timing of acquiring data is set every temporary stop or set to a timing of pushing an input button (a hardware key or a touch input button on a display panel) when a driver of a vehicle wants to know the remaining capacity or the like. In the case where the input button is pushed during running, an internal resistance value of a secondary battery, which is a value at the time of previous temporary stop, is to be displayed.

A structure of the invention disclosed in this specification is a method for estimating internal resistance of a secondary battery in an electric vehicle that is being driven and at least includes the secondary battery, a neural network portion for estimating internal resistance of the secondary battery, a charging circuit for charging the secondary battery, and a regenerative brake for performing regenerative charging on the secondary battery. The method includes steps of starting the regenerative charging of the secondary battery when a driver brakes, extracting data of the secondary battery while the electric vehicle and the charging are stopped, inputting the data of the secondary battery to the learned neural network portion, and outputting estimated internal resistance of the secondary battery. The data of the secondary battery is data limited within a certain time range around the end of the regenerative charging.

In the above structure, the certain time range around the end of the regenerative charging ranges from a point of time before the end of regenerative charging to include a point of resting time later than the end. The shorter the time range is, the more reduced the amount of data can be. Meanwhile, when the amount of data is too reduced, the accuracy of an estimated value may be decreased. The preferable time range is approximately a few minutes, and the further preferable time range is approximately one minute. However, this time depends on the kind and number of batteries and the level of regenerative charging, in some cases.

In the above structure, one or more selected from a temperature, a voltage, a power, a current, and a voltage after the rest is/are selected as data which the neural network portion learns and the data of the secondary battery.

To detect an anomaly of the secondary battery on the basis of the estimated internal resistance is also one of the present inventions. Another structure of the invention is a method for detecting an anomaly of a secondary battery in an electric vehicle that is being driven and at least includes the secondary battery, a neural network portion for estimating internal resistance of the secondary battery, a charging circuit for charging the secondary battery, and a regenerative brake for performing regenerative charging on the secondary battery. The method includes steps of starting the regenerative charging of the secondary battery when a driver brakes, extracting data of the secondary battery while the electric vehicle and the charging are stopped, inputting the data of the secondary battery to the learned neural network portion, outputting an estimated internal resistance of the secondary battery, and comparing a value of the estimated resistance with a reference value stored in advance in a memory.

The structure uses the regenerative charging to estimate the internal resistance efficiently in the electric vehicle; however, the charging for the estimation is not particularly limited. A charging device for the estimation may be separately provided, or charging from a cranking battery (also referred to as a starter battery) used in engine starting may be used. A lithium ion secondary battery is charged in a short time by the cranking battery at the timing of acquiring data; after that, the charging is stopped for one minute, and data is acquired. In this case, the lithium ion secondary battery can be charged in a short time on the basis of a charging voltage, a charging current, and a charging time, which are predetermined, so that the internal resistance can be estimated immediately after the driving starts.

Accurate measurement of the internal resistance is difficult unless charging and discharging are conducted under a constant condition. However, it is impractical to test charging and discharging in a static state of the electric vehicle or the like, only for measuring the internal resistance of the battery. To calculate the internal resistance accurately even when conditions such as temperatures or charging and discharging currents vary to some extent, the above means with machine learning is used, so that highly accurate estimation of the internal resistance can be performed with a temporary stop during running.

Sampling with predetermined charging conditions and resting conditions is carried out on the secondary battery, whereby data from the sampling can be accumulated, and estimation of the internal resistance, which is based on the data, becomes possible with use of the neural network portion. Sampling treatment is performed a plurality of times in advance, and data of the sampling treatment is learned. A sampling period is provided during running and another sampling treatment is performed, so that data is acquired.

With the estimation of the internal resistance, the deterioration of the secondary battery can be examined, and the remaining life can be predicted.

Effect of the Invention

Highly accurate detection of the internal resistance is possible without an enormous amount of data. Thus, the calculation processing time can be shortened. Furthermore, the scale of hardware used for the estimation can be relatively small. Therefore, an estimation device can be implemented in a vehicle such as an electric vehicle.

BRIEF DESCRIPTION OF THE DRAWINGS

FIG. 6 shows an example of a record of a program including a source code stored in a memory used in one embodiment of the present invention.

MODE FOR CARRYING OUT THE INVENTION

Embodiments of the present invention are described in detail below with reference to the drawings. Note that the present invention is not limited to the following description, and it is readily understood by those skilled in the art that modes and details of the present invention can be modified in various ways. In addition, the present invention should not be construed as being limited to the description of the embodiments below.

Embodiment 1

An example of a structure of an estimation device 100 implemented in an electric vehicle such as an electric automobile will be described with reference to FIG. 1.

The estimation device 100 is a device for estimating the internal resistance of a secondary battery 101.

The internal resistance of the secondary battery 101 varies depending on temperatures and is accordingly monitored with a temperature sensor 105.

The secondary battery 101 is used as a battery pack (also referred to as an assembled battery) in which a plurality of secondary batteries are connected in series or in parallel and provided with a protection circuit. The battery pack means a container (a metal can or a film exterior body) in which a plurality of secondary batteries and a predetermined circuit are stored together for easy handling of the secondary battery 101. The battery pack has an ECU (Electronic Control Unit) in order to manage the operation state.

Figure 1:
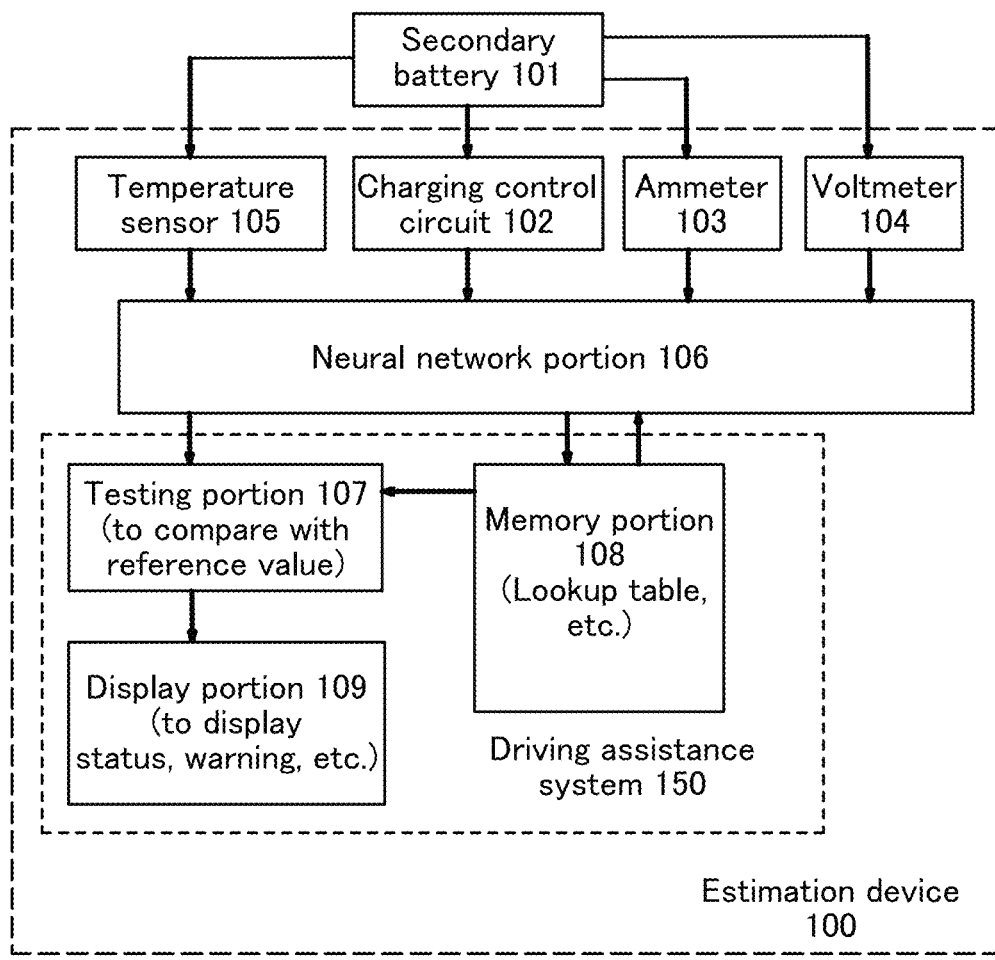
FIG. 1 is a block diagram illustrating one embodiment of the present invention.

In the case of FIG. 1, the ECU at least includes a charging control circuit 102, an ammeter 103, and a voltmeter 104. The ECU may have a structure including a neural network portion 106. Alternatively, an ECU for a driving assistance system 150 may be provided separately or may be integrated with the above ECU.

Although not illustrated, an electric generator for regenerative charging is connected to the charging control circuit 102. Regenerative charging indicates that the secondary battery is charged in regenerative braking including power regeneration in the case of foot brake operation during driving a vehicle. Even without foot brake operation, power is regenerated by the AC motor when the vehicle is decelerated without being accelerated; accordingly regenerative charging is performed.

The neural network portion 106 is achieved with a microcontroller which performs software processing. The microcontroller is obtained by incorporating a computer system into one integrated circuit (IC). When the calculation scale or data to be handled is large, a plurality of ICs are combined to form the neural network portion 106. It is preferable to use a microcontroller incorporating Linux (registered trademark) which enables use of free software because the total cost of forming the neural network portion 106 can be reduced. Other OSs (operating systems), without limited to Linux (registered trademark), may be used.

Learning of the neural network portion 106 illustrated in FIG. 1 is described below.

A program is created with use of Python in system requirements of Linux (registered trademark). The program is stored in a memory and executed by the microcontroller.

In this embodiment, a data frame of Pandas is used. Pandas is a library providing a function convenient for data analysis using Python. In addition, a warning filter is used to control warnings, so that coinciding warnings are not output. In addition, Numpy is loaded so that Python deals with a library of Numpy. FIG. 6 shows a recode of a program including a source code stored in the memory.

The source codes corresponding to the above processing are shown sequentially below a row of In[1] in FIG. 6.

Figure 5:
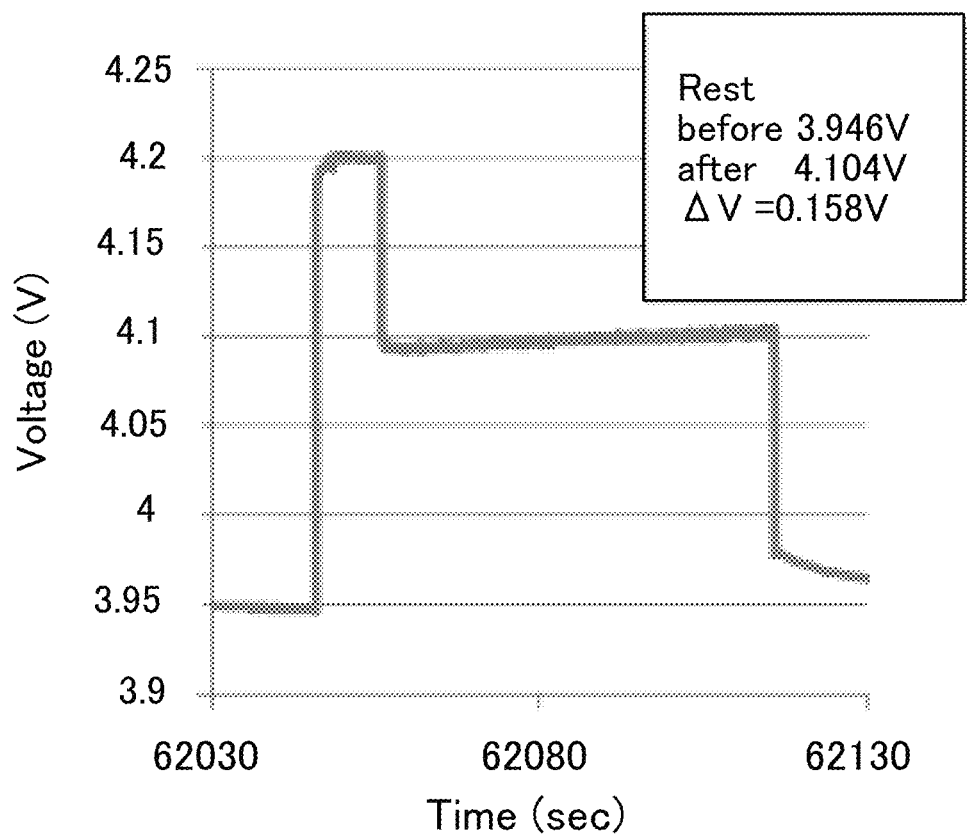
FIG. 5 is a graph showing an example of data used for estimation described in one embodiment of the present invention.

Next, data is read. The data is acquired in advance. FIG. 5 shows an example of the data. The data in FIG. 5 is a graph showing the relation between the voltage and the time under such a condition that 60 seconds of the rest time follows a few seconds of regenerative charging. The odd columns and even columns in the whole of data are respectively test data and training data. As the data, data in a data file "X label.csv" is read.

The source codes corresponding to the above processing are shown sequentially below a row of In[2] in FIG. 6.

Part of data in a data file "x_label.csv" (for ten rows) is shown in Table 1. Actually, data for 143 rows in total is prepared. To acquire data, with three temperature conditions of 20° C., 25° C., and 30° C., the followings are actually measured in time series: voltage (V) before regenerative charging; power consumption (P); current (I) in 1C; voltage (60 secV) at the time when 60 seconds have passed after the charging stops; a difference (DeltaV) between 60 secV and the voltage V before regenerative charging; and SOH (State Of Health). Note that data of SOH is acquired with use of two kinds of secondary batteries with different deterioration rates, 1 and 0.9.

TABLE 1

| Tem-perature | V | Discharge current | I | P | 60 secV | DeltaV | SOH |
|---|---|---|---|---|---|---|---|
| 20 | 3.251 | 3249.882 | 162.66 | 10565 | 3.846 | 0.595 | 0.9 |
| 25 | 2.727 | 3250.56 | 162.73 | 8864.3 | 3.392 | 0.665 | 0.9 |
| 25 | 2.947 | 3251.577 | 162.66 | 9582.4 | 3.545 | 0.598 | 0.9 |
| 30 | 3.273 | 3251.916 | 162.7 | 10644 | 3.625 | 0.352 | 1 |
| 20 | 2.619 | 3252.256 | 162.94 | 8517.7 | 3.376 | 0.757 | 0.9 |
| 25 | 3.604 | 3252.595 | 162.78 | 11722 | 3.945 | 0.341 | 1 |
| 25 | 3.128 | 3252.595 | 162.66 | 10174 | 3.709 | 0.581 | 0.9 |
| 25 | 2.871 | 3252.934 | 162.8 | 9339.2 | 3.348 | 0.477 | 1 |
| 25 | 2.717 | 3253.273 | 162.6 | 8839.1 | 3.388 | 0.671 | 0.9 |
| 20 | 3.264 | 3253.273 | 162.46 | 10619 | 3.853 | 0.589 | 0.9 |

Next, data in a data file "y_label.csv" is read. The odd columns and even columns in the whole of data are respectively test data and training data.

The source codes corresponding to the above processing are shown sequentially below a row of In[3] in FIG. 6.

Part of data in a data file "y_label.csv" (for ten rows) is shown in Table 2. Actually, data for 143 rows in total is prepared.

TABLE 2

| Internal resistance |
|---|
| 183 |
| 205 |
| 184 |
| 108 |
| 233 |
| 105 |
| 179 |
| 147 |
| 206 |
| 181 |

To create the training data and the test data, scikit-learn (also referred to as Sklearn) that is a machine learning library of Python is used. Here, a learning model is made.

The source codes corresponding to the above processing are shown sequentially below a row of In[4] in FIG. 6.

Note that ExtraTrees is one of derivative forms of random forest. The random forest is one of algorithms of machine learning and used for classification, regression, and clustering.

ExtraTrees is an ensemble learning algorithm using a decision tree as a weak learner.

The learning is performed in accordance with the learning model, so that a predicted value of y is output.

The source codes corresponding to the above processing are shown sequentially below a row of In[5] in FIG. 6.

The program of the source codes sequentially shown below a row of In[6] in FIG. 6 is for processing of data output and saving.

When a predicted value of internal resistance is output with use of the program of the source codes shown in FIG. 6, a value with relatively high accuracy can be obtained.

Figure 7:
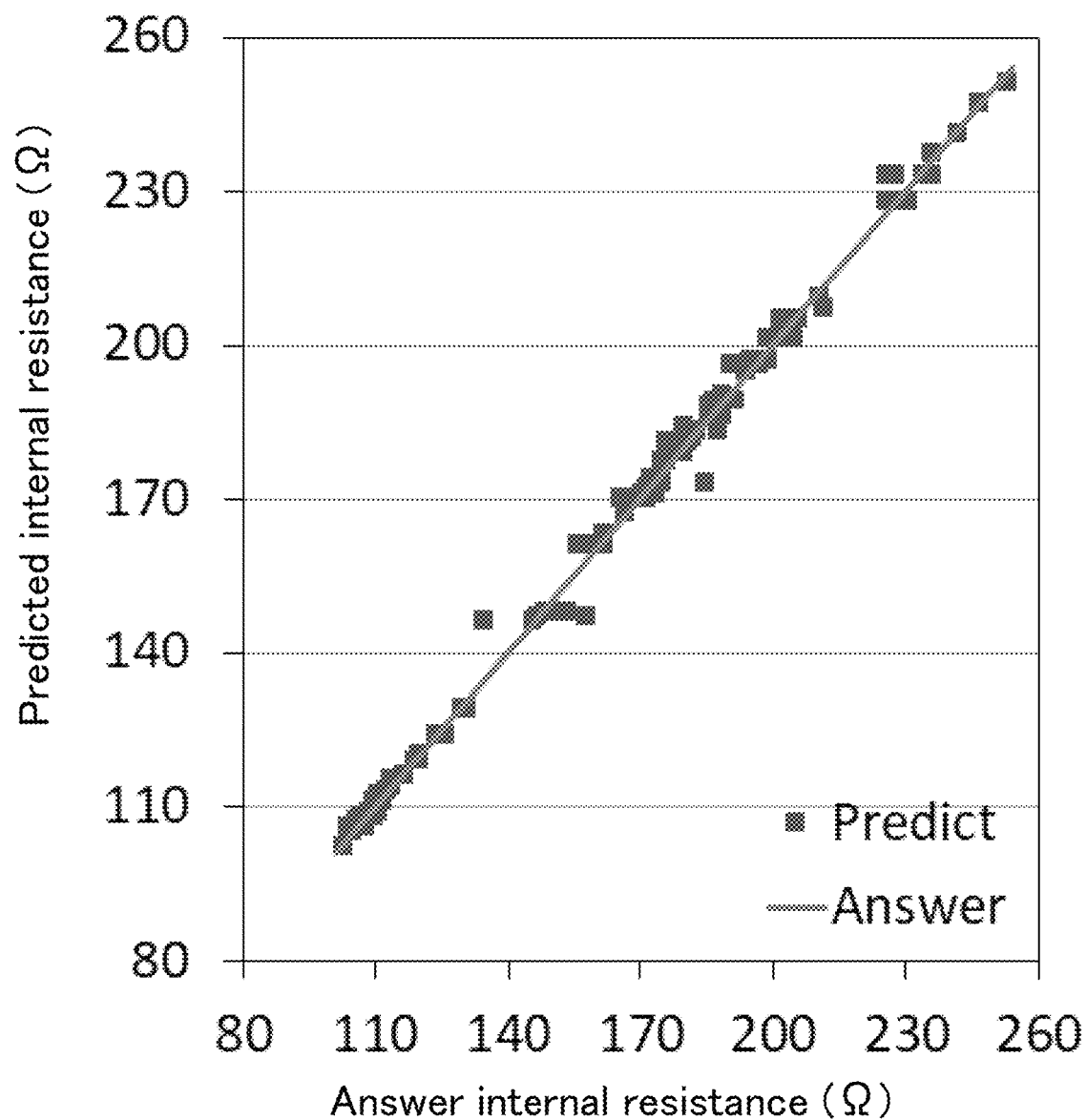
FIG. 7 is a graph showing comparison between estimation results and answer data results described in one embodiment of the present invention.

FIG. 7 shows a graph showing estimated values output through the input of data including data in Table 1 and Table 2 and the use of the program of the source codes shown in FIG. 6. In FIG. 7, the answer internal resistance is denoted by Answer, and the predicted internal resistance (estimated value) is denoted by Predict. The mean error rate of Answer to Predict is 0.82%, which is an excellent value. The error rate is a percentage of a value obtained by dividing a difference between an estimated value and answer internal resistance by the answer internal resistance. The mean value of the sum of the values of the error rates is the mean error rate.

Figure 8:
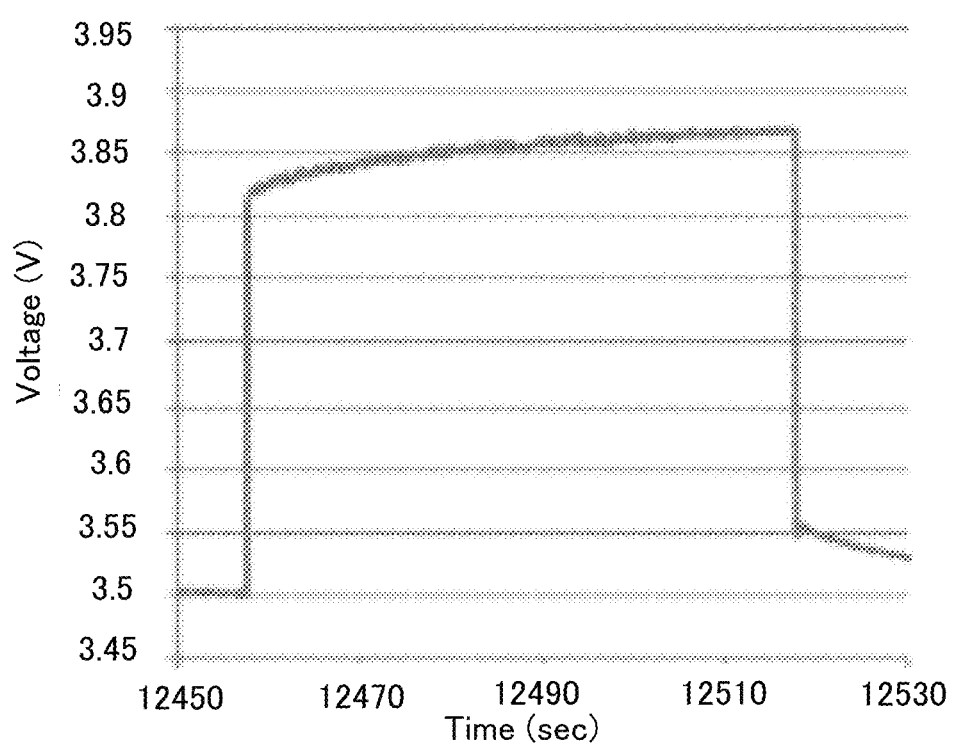
FIG. 8 is a graph showing an example of data used for estimation as a comparative example.

For comparison, learning and inference were performed with use of data different from that in FIG. 5, specifically data without regenerative charging shown in FIG. 8, resulting in 5.97% of the mean error rate.

The time required for outputting a predicted value of internal resistance is greater than or equal to 0.35 seconds and less than or equal to 0.4 seconds, which means that the calculation processing can be terminated in a short time. For the calculation processing, either a CPU or a GPU may be used, and there is almost no difference in time required to output the predicted value of internal resistance in either case. The capacity needed for the execution of the above Python program is about 100 MB.

In the calculation processing, the product-sum operation may be used, and a memory that stores data temporarily is used for the calculation. A memory including transistors using an oxide semiconductor may be used to reduce power consumption. In this specification and the like, a transistor including an oxide semiconductor in a semiconductor layer in which a channel is formed is also referred to as an "OS transistor". Any one or more of indium, an element M (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like), and zinc can be used, for example, as an oxide semiconductor. In particular, the oxide semiconductor is preferably an oxide semiconductor containing indium, gallium, and zinc. An OS transistor has a characteristic of extremely low off-state current. Note that the oxide semiconductor can be formed by, for example, a sputtering method or an ALD (Atomic Layer Deposition) method.

When the estimation in the neural network portion 106 is finished, the estimated value and the reference value are compared in a testing portion 107, whereby anomaly detection can be performed. As the reference value, one of reference values stored in advance in a lookup table or the like in a memory portion 108 may be selected. The data stored in the lookup table is data assigned to output corresponding to input. The data includes arrangement of a plurality of parameters and is data for a correlation table. The lookup table also includes data assigned to output corresponding to input with use of a function such as a formula. When determination of anomaly can be made from a comparison result of a large difference between the estimated value and the reference value, a display portion 109 can perform display of anomaly detection. This is one of structures enabled by the driving assistance system 150. When the display portion 109 is shared with a display portion of an automotive navigation system, warnings (including a status or alert) of anomaly in a secondary battery are displayed concurrently with a map, which can call attention to a driver.

Although the description is given to a vehicle a driver drives in this embodiment, this embodiment is not limited thereto. With a combination of ECU performing image processing with a radar or a camera taking images of the periphery of the vehicle, this embodiment can be applied to a vehicle that can perform semi-automatic operation or a vehicle that can perform full automatic operation.

Embodiment 2

Figure 2:
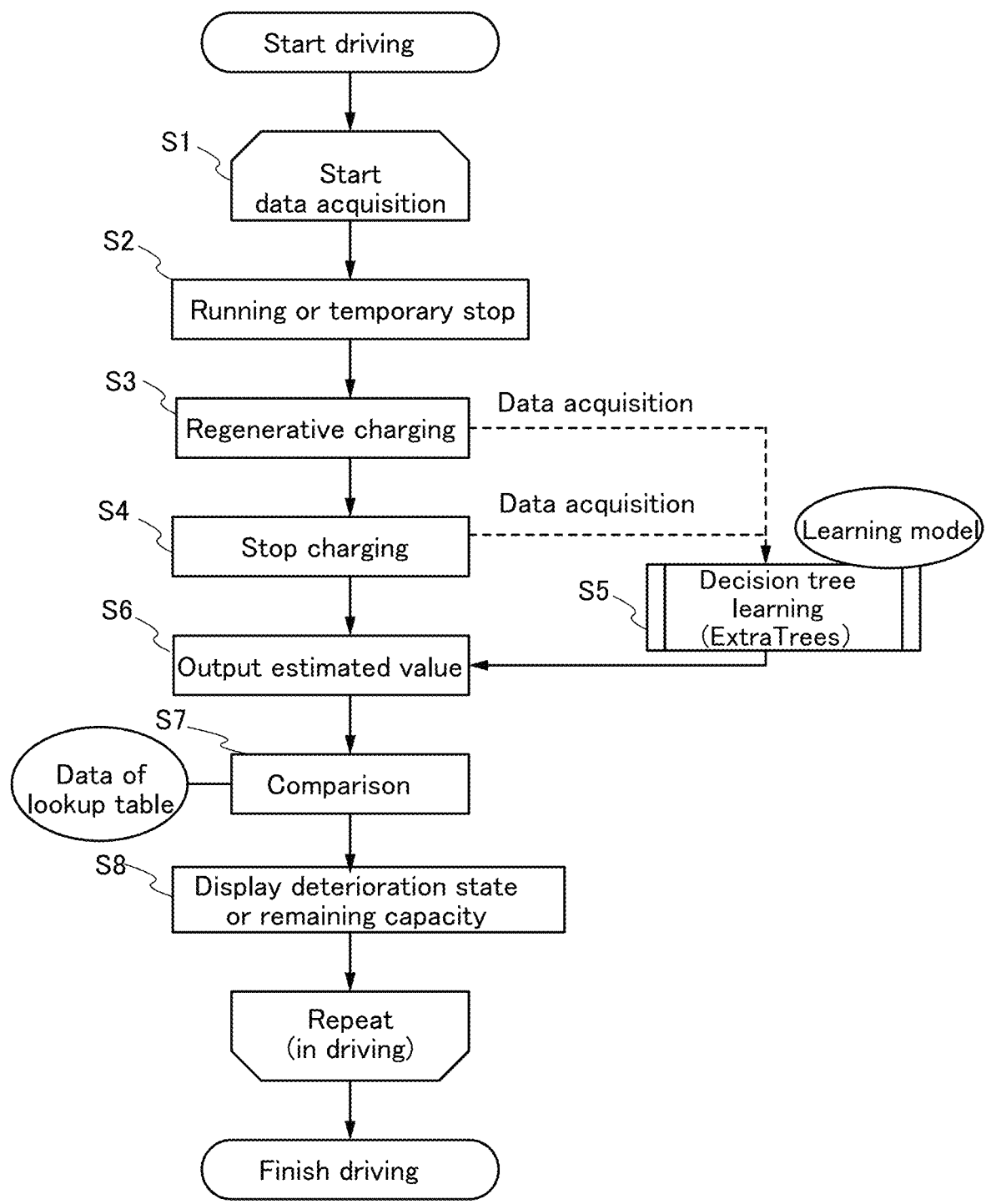
FIG. 2 is a flow chart showing one embodiment of the present invention.

In this embodiment, a procedure of displaying a deterioration state or the remaining capacity with use of the learning model or the program shown in Embodiment 1 will be described. The procedure is illustrated in FIG. 2.

By activation of an electric vehicle such as an electric automobile incorporating the estimation device shown in Embodiment 1, driving starts.

Preparation for acquiring data for predicting internal resistance of a secondary battery starts, and data acquisition starts (S1). Note that as temperature data, the environmental temperature in the periphery of the secondary battery is constantly measured with a temperature sensor.

In running or temporary stop of the vehicle, the secondary battery is discharged by pedaling for acceleration, and the secondary battery is charged in a regenerative manner by deceleration without pedaling for acceleration. In addition, the vehicle temporarily stops in accordance with a stop signal from a traffic light. The vehicle performs such running or temporary stop a plurality of times until reaching the destination (S2). The period for a stop caused by a red signal from the traffic light is mostly greater than or equal to one minute and less than or equal to two minutes 30 seconds; accordingly, data can be acquired by the stop caused by the red signal.

The data fulfilling some conditions during the running or temporary stop can be learning data. Acquired data is in a period during which regenerative charging is at least performed and a temporary stop is made. Data in a certain time range around the end of the regenerative charging is predetermined to be acquired. First, data is acquired at a time of the regenerative charging (S3). As the data acquired here, the voltage before the regenerative charging is measured.

Next, charging is stopped after the regenerative charging, and data is acquired (S4). As the data acquired here, the voltage at the time when 60 seconds have passed from the stop of regenerative charging is measured. In this embodiment, the certain time range around the end of the regenerative charging is approximately 60 seconds+the regenerative charging time period (at least one second or more).

Calculation is performed, with use of the acquired data, on a leaning model that has been learned in advance (S5). As the algorithm of decision tree learning, that is, ExtraTrees, for example, one of libraries of Skleam can be used.

An estimated value of internal resistance is output (S6).

Then, the estimated value is compared to data in the lookup table that stores data of reference values corresponding to temperatures or deterioration rates (S7).

Through comparison with the reference value of data in the lookup table, the corresponding deterioration state and remaining capacity is displayed (S8).

At least the above steps from S1 to S8 are repeated, whereby the deterioration state or remaining capacity of the secondary battery can be grasped at the time of running or temporary stop. A driver can check the remaining capacity of the secondary battery and go to a power charging station selected on the basis of the remaining capacity of the secondary battery. Furthermore, on the basis of such information, the driving assistance system described in Embodiment 1 may provide the driver with a recommended route for the destination or the power charging station.

Embodiment 3

Figure 3:
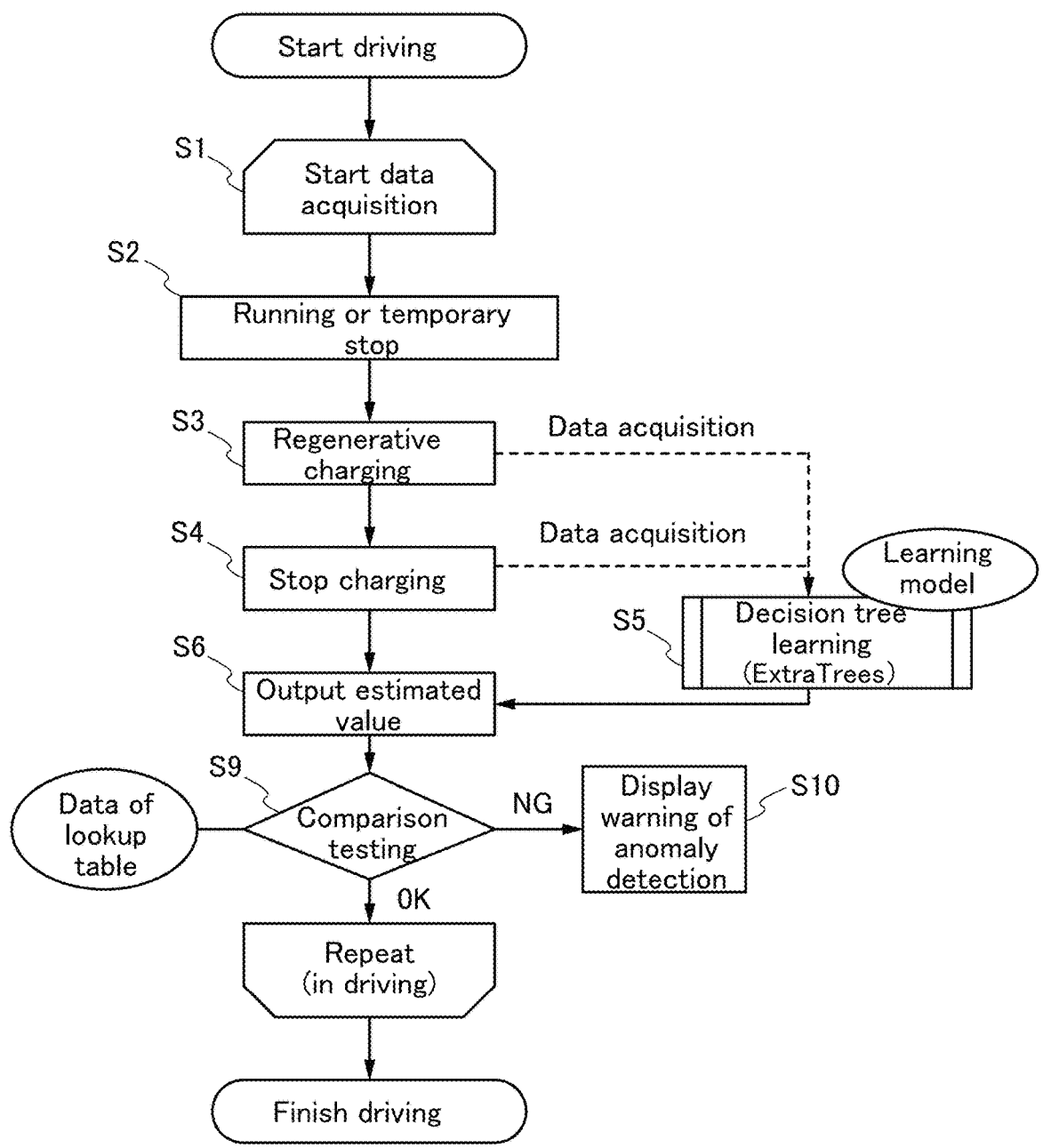
FIG. 3 is a flow chart showing one embodiment of the present invention.

In this embodiment, a procedure of anomaly detection or anomaly warning display performed with the learning model and the program described in Embodiment 1 will be described. The procedure is illustrated in FIG. 3. Note that the procedure has many steps the same as those in FIG. 2, and the same steps are denoted by the same reference numerals. Step S1 to Step S6 in FIG. 3 are the same as those in FIG. 2.

First, by activation of an electric vehicle such as an electric automobile incorporating the estimation device shown in Embodiment 1, driving starts.

Preparation for acquiring data for predicting internal resistance of a secondary battery starts (S1). Note that as temperature data, the environmental temperature is constantly measured with a temperature sensor.

In running or temporary stop of the vehicle, the secondary battery is discharged by pedaling for acceleration, and the secondary battery is charged in a regenerative manner by deceleration without pedaling for acceleration. In addition, the vehicle temporarily stops in accordance with a stop signal from a traffic light. The vehicle performs such running or temporary stop a plurality of times until reaching the destination (S2). When the running starts after the secondary battery is fully charged, a period without regenerative charging is provided to prevent overcharge.

After the secondary battery becomes into a state capable of regenerative charging, by power consumption, from the state of being fully charged, data is acquired in regenerative charging (S3). As the data acquired here, a voltage before regenerative charging is measured.

After the regenerative charging, the charging is stopped, and data is acquired (S4). As the data acquired here, a voltage at the time when 60 seconds have passed from the stop of the regenerative charging is measured.

Calculation is performed with a leaning model that has been learned in advance using the acquired data (S5). As the algorithm of ExtraTrees, for example, one of libraries of Skleam can be used.

An estimated value of internal resistance is output (S6).

The present estimated value is compared with an estimated value that is the last estimation result to test (S9). A difference between the last estimated value and the present estimated value (absolute value) is used as a reference for anomaly testing. As data of the lookup table, the size of the difference regarded as anomaly detection, which relates to the temperature, is stored.

When the difference, that is, a variation in estimated values is larger than the data of the lookup table, the detection result is determined as anomaly, and a warning of anomaly detection is displayed for a driver of the vehicle or the like (S10).

When the difference, that is, a variation in estimated values is smaller than the data of the lookup table, the detection result is determined as normal.

The anomaly detection is performed by repeating the above steps during running, whereby the vehicle can continue running safely.

In addition, this embodiment can be combined with Embodiment 2. With use of the data of the lookup table relating to the internal resistance shown in Embodiment 2, the corresponding deterioration state or remaining capacity can be displayed. In that case, anomaly detection can also be performed when there is a large difference in the comparison of the data of the lookup table relating to a variation in estimated value shown in this embodiment.

Embodiment 4

Figure 4:
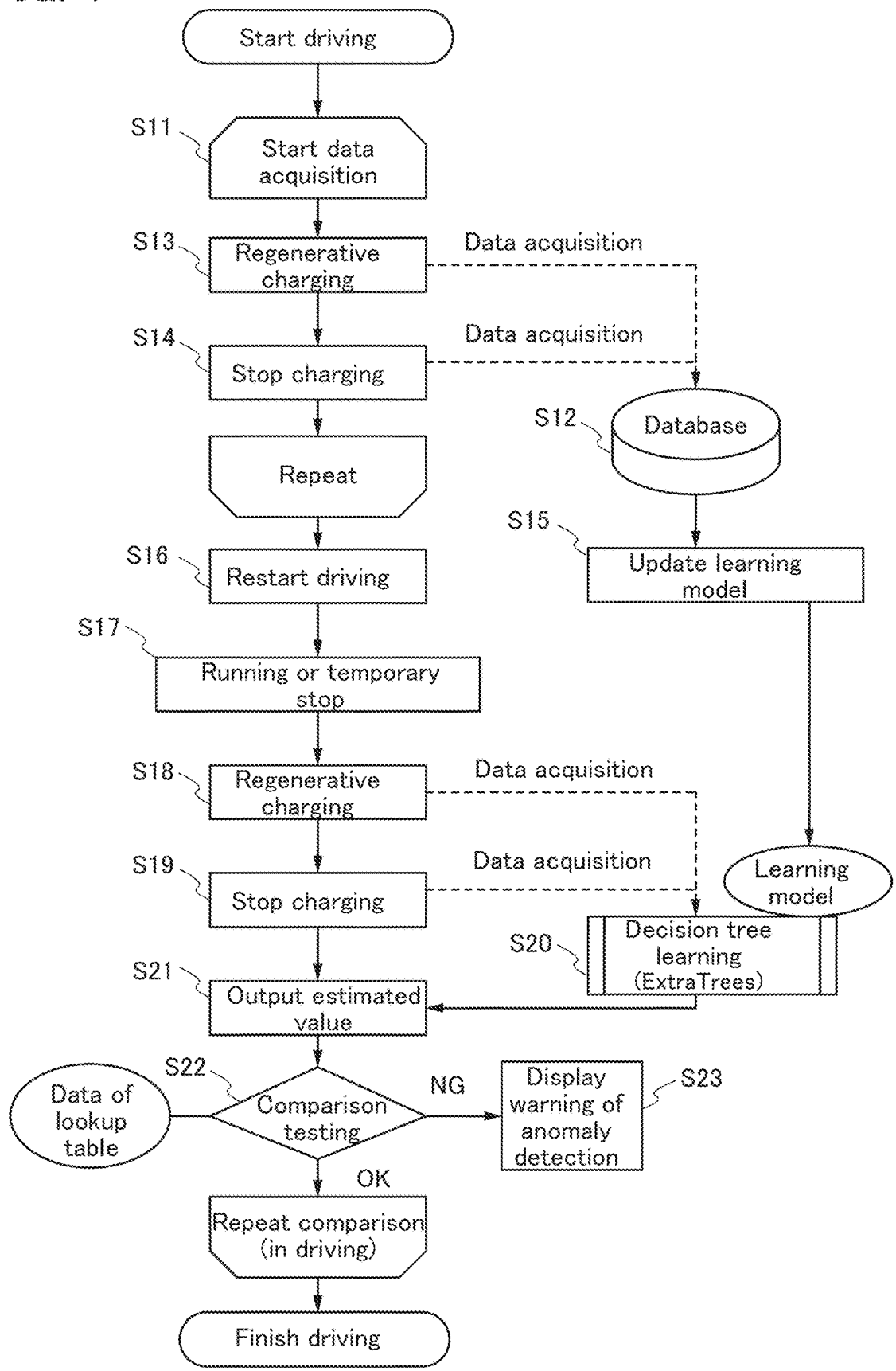
FIG. 4 is a flow chart showing one embodiment of the present invention.

In this embodiment, a procedure of anomaly detection performed by collecting data and updating a learning model while a vehicle is running will be described. The procedure is illustrated in FIG. 4.

First, an electric vehicle such as an electric automobile incorporating an estimation device is activated. The estimation device shown in this embodiment includes at least a database that can store learning data and hardware that can update a data learning model.

First, data acquisition starts (S11).

Then, the driving starts, and data is acquired in regenerative charging (S13). As the data to be acquired here, a voltage before regenerative charging is measured.

The charging is stopped when the regenerative charging is finished, and data is acquired (S14). As the data to be acquired here, a voltage at the time when 60 seconds have passed from the stop of the regenerative charging is measured. In this embodiment, the certain time range around the end of the regenerative charging is approximately 60 seconds+the regenerative charging time period (at least one second or more).

The above data acquisition is repeated.

The acquired data is stored in the database (S12). At the stage when the data for creating or updating a learning model is acquired, the learning model is updated (S15). To construct a model by an ensemble learning algorithm, a prepared dataset is divided into two, training data and test data, to create a predictive model, and evaluation is performed thereon. The relation of variables is learned only using the training data to form a machine learning model in which, in response to the input of a variable A, a variable B is output. To create the training data and the test data, scikit-learn, a machine learning library of Python, is used.

Although showing an example in which data is acquired at the initial stage of running, this embodiment is not limited thereto. Data for learning may be prepared in advance for the database. For example, past data collected in previous running or learning data acquired beforehand by an electric-vehicle manufacturer is acquired. Such data is stored in advance in the database. Although the database is used in this embodiment, a memory having capacity enough to store acquired data may be used. The database may be updated as appropriate directly or indirectly (wirelessly) from an external device (such as an external server).

When the update of the leaning model is finished, the driving restarts (S16). In this embodiment, steps from S11 to S16 can be regarded as a first stage for leaning.

A second stage for the estimation is shown below.

Running or temporary stop is performed a plurality of times (S17).

Data is acquired in regenerative charging (S18). As the data to be acquired here, a voltage before the regenerative charging is measured.

The charging is stopped when the regenerative charging is finished, and data is acquired (S19). As the data to be acquired here, a voltage at the time when 60 seconds have passed from the stop of the regenerative charging is measured. In this embodiment, the certain time range around the end of the regenerative charging is approximately 60 seconds+the regenerative charging time period (at least one second or more).

Calculation is performed with the leaning model that has been learned in advance using the acquired data (S20). As the algorithm of ExtraTrees, for example, one of libraries of Skleam can be used.

An estimated value of internal resistance is output (S21).

Next, a third stage for anomaly detection is shown below.

The present estimated value is compared with an estimated value that is the last estimation result to test (S22). A difference between the last estimated value and the present estimated value (absolute value) is used as a reference for anomaly testing. As data of a lookup table, the size of the difference regarded as anomaly detection, which relates to the temperature, is stored.

When the difference, that is, a variation in estimated values is larger than the data of the lookup table, the detection result is determined as anomaly, and the warning display of anomaly detection is performed with respect to a driver of the vehicle or the like (S23).

When the difference, that is, a variation in estimated values is smaller than the data of the lookup table, the detection result is determined as normal.

The vehicle can continue running safely while performing the update of the learning model and the anomaly detection by repeating the first stage, the second stage, and the third stage during the running as described above. Not an enormous amount of data during the running but the relatively small amount of data (data within a short time period around the temporary stop) is used, whereby the memory capacity and the calculation amount can be reduced, and highly accurate estimation and anomaly detection can be performed.

In addition, this embodiment can be freely combined with any one of Embodiments 1 to 3.

REFERENCE NUMERALS

100: estimation device, 101: secondary battery, 102: charging control circuit, 103: ammeter, 104: voltmeter, 105: temperature sensor, 106: neural network portion, 107: testing portion, 108: memory portion, 109: display portion, 150: driving assistance system

The invention claimed is:

1. A method for estimating internal resistance of a secondary battery in an electric vehicle,
   wherein a vehicle comprises a secondary battery, a learned neural network portion for estimating internal resistance of the secondary battery, a regenerative brake for performing regenerative charging on the secondary battery, and a charging circuit for the regenerative charging of the secondary battery,
   wherein the method comprises:
      performing regenerative charging of the secondary battery when a brake of the vehicle runs;
      measuring data of the secondary battery while the electric vehicle is stopped with regenerative charging not running;
      inputting the data of the secondary battery to the learned neural network portion; and
      outputting estimated internal resistance of the secondary battery from the learned neural network portion, and
   wherein the data of the secondary battery is data limited within a first time range around an end of the regenerative charging.

2. The method for estimating internal resistance of a secondary battery in an vehicle according to claim 1, wherein the first time range comprises a point of time before the end of regenerative charging and a point of resting time later than the end of regenerative charging.

3. The method for estimating internal resistance of a secondary battery in an vehicle according to claim 1, wherein each of learning data to prepare the learned neural network portion and the data of the secondary battery includes one or more selected from a temperature, a voltage, a power, a current and a voltage.

4. A method for detecting an anomaly of a secondary battery in an electric vehicle,
   wherein a vehicle comprises a secondary battery, a learned neural network portion for estimating internal resistance of the secondary battery, a regenerative brake for performing regenerative charging on the secondary battery, and a charging circuit for the regenerative charging of the secondary battery,
   wherein the method comprises:
      performing regenerative charging of the secondary battery when a brake of the vehicle runs;
      measuring data of the secondary battery while the electric vehicle is stopped with regenerative charging not running;
      inputting the data of the secondary battery to the learned neural network portion;
      outputting estimated internal resistance of the secondary battery from the learned neural network portion; and
      comparing a value of the estimated internal resistance with a reference value stored in advance as a range of a normal internal resistance in a memory.

\* \* \* \* \*